(12) United States Patent
Voldman

(10) Patent No.: US 7,358,572 B2
(45) Date of Patent: Apr. 15, 2008

(54) RADIATION TOLERANT ELECTROSTATIC DISCHARGE PROTECTION NETWORKS

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 11/162,999

(22) Filed: Sep. 30, 2005

(65) Prior Publication Data

US 2007/0075373 A1    Apr. 5, 2007

(51) Int. Cl.
    *H01L 23/62* (2006.01)
(52) U.S. Cl. ...................... 257/360; 257/355
(58) Field of Classification Search ............... 257/360, 257/355
    See application file for complete search history.

(56) References Cited

U.S. PATENT DOCUMENTS

| | | | |
|---|---|---|---|
| 5,175,605 A | 12/1992 | Pavlu et al. | |
| 5,418,473 A | 5/1995 | Canaris | |
| 5,504,703 A | 4/1996 | Bansal | |
| 5,600,525 A * | 2/1997 | Avery | 361/56 |
| 5,870,332 A | 2/1999 | Lahey et al. | |
| 6,133,747 A | 10/2000 | Cameron | |
| 6,369,630 B1 | 4/2002 | Rockett | |
| 6,417,710 B1 | 7/2002 | Bartholet | |
| 6,426,855 B2 * | 7/2002 | Lee et al. | 361/56 |
| 6,549,443 B1 | 4/2003 | Jensen et al. | |
| 6,614,257 B2 | 9/2003 | Knowles | |
| 6,703,858 B2 | 3/2004 | Knowles | |

OTHER PUBLICATIONS

Ziegler, J.F., Terrestrial cosmic rays, IBM J. Res. Develop. Jan. 1996, pp. 19-39, vol. 40, No. 1, USA.
Srinivasan, G.R., Modeling the cosmic-ray-induced soft-error rate in integrated circuits: An overview, IBM J. Res. Develop. Jan. 1996, pp. 77-89, vol. 40, No. 1, USA.
Tang, H.H.K., Nuclear physics of cosmic ray interaction with semiconductor materials: Particle-induced soft errors from a physicists's perspective, IBM J. Res. Develop. Jan. 1996, pp. 91-108, vol. 40, No. 1, USA.

* cited by examiner

*Primary Examiner*—Douglas M. Menz
(74) *Attorney, Agent, or Firm*—Schmeiser, Olsen & Watts; Anthony J. Canale

(57) ABSTRACT

Realizing that rather than protect electronic circuitry, electrostatic discharge networks when hit by cosmic rays and charged particles, can actually cause the electronic circuitry in satellites and other space applications to fail, the inventor created an ESD network having a redundant voltage clamping element in series with a first voltage clamping element between two voltage pads. The ESD network may be connected to a power voltage pad or a signal voltage pad either directly or through a dummy voltage pad. The voltage clamping elements may further comprise an array of unit cells wherein the array is electrically equivalent to single large transistors currently used in ESD networks. By creating an ESD network as an array of unit cells, benefits greater than those obtained by using a single transistor as a clamping or a trigger element are realized—such as increased ballast resistance and less overall damage to the circuitry resulting from cosmic rays and particles.

20 Claims, 9 Drawing Sheets

RADIATION TOLERANT ELECTROSTATIC DISCHARGE PROTECTION NETWORKS

FIELD OF THE INVENTION

This invention relates generally to the field of protection of semiconductor circuits from radiation effects, and in particular relates to creating electrostatic discharge (ESD) circuits that are tolerant of single event upsets.

BACKGROUND OF THE INVENTION

Semiconductor circuits are composed of a regular arrangement of atoms, usually silicon. In semiconductors, the arrangement of the atoms are often in a lattice or mesh arrangement and the electrons and the holes created by the lack of electrons are free to move within planes of the lattice. As semiconductor devices become smaller and smaller, fewer and fewer atoms are used to create an electronic device. Transistors of semiconductor materials often store sufficient charge to create digital information by storing a 0 or a 1 state depending upon the threshold voltage of the transistor.

The primary component of nature is space and so there is mostly space between the atoms in a semiconductor lattice. Also, as in all of nature, space is not quiet but rather active with high energetic particles including heavy ions and cosmic rays from solar or galactic origins moving about, colliding, transferring energy. These particles and/or rays collide with atoms in the semiconductor lattice and through elastic, inelastic collisions, and/or field interactions between the energetic particles and the atoms and/or electrons in the lattice, the atoms and/or electrons in the lattice may either change energy and/or position such that the electronic state of the semiconductor device is no longer reliable. For instance, when the intruding particle is near a p-n junction, it may induce a soft error, or single-event upset because of the excess electron-hole pairs generated. If the electromagnetic field in the neighborhood of the p-n junction is sufficiently strong, the charged electrons and holes separate to a nearby device contact and when or if the collected charge exceeds a critical threshold value, a random signal is registered. This is not an unusual occurrence. The Van Allen belt is a small region of high-energy particles held captive by the magnetic influence of the Earth approximately 4000 miles or so above the Earth's surface. The Van Allen belt consists mainly of high-energy protons, ten to fifty million electron volts (10-50 MeV), that are by-product of cosmic radiation. The probability of a nuclear hit between an energetic neutron interacting with a silicon large scale integrated (LSI) circuit is one out of 40,000 incident neutrons will interact within 10 microns of the circuit; further calculations reveal that at sea level almost every silicon-neutron hit within one micron of a LSI circuit results in a soft error of single-event upset. During a quiet sun period, the primary flux of particles averages seventy percent protons and thirty percent neutrons, but during an active sun period the number of solar particles hitting the outer atmosphere increases a millionfold, and is larger than the flux of intragalactic cosmic rays. Thus, soft-errors or single event upsets are a real concern for satellites and satellite-based communications and technology.

A single event upset (SEU) is defined by NASA as radiation-induced errors in microelectronic circuits caused when charged particles lose energy by ionizing the medium through which they pass, leaving behind a wake of electron-hole pairs. SEUs are transient soft errors and are non-destructive. A reset or rewriting of the device results in normal device behavior thereafter. SEUs typically appear as transient pulses in logic or support circuitry, or as bit flips in memory cells or registers. A multiple-bit SEU occurs when a single ion hits two or more bits causing simultaneous errors. Multiple-bit SEU is a problem for single-bit error detection and correction where it is impossible to assign bits within a word to different chips, such a dynamic random access memories (DRAMs) and certain static random access memories (SRAMs). A severe SEU is the single-event functional interrupt in which an SEU in the device=s control circuitry places the device into a test mode, halt, or undefined state.

A single event latchup (SEL) is a condition that causes loss of device functionality because of a single-event induced current state. SELs are hard errors, and may cause permanent damage to the device. SEL results in a high operating current above the device specification and the latched condition can destroy the device, drag down the bus voltage, or damage the power supply. An SEL can be cleared by a power off-on reset or power strobing of the device, but if the power is not removed quickly, catastrophic failure may occur because of excessive heat, or metallization or bond failure.

Single event burnout (SEB) is a more severe condition that causes device destruction because of high currents in a power transistor. SEBs include burnout of power MOSFETs, gate rupture, frozen bits, and noise in charge-coupled devices. An SEB can be triggered in a power MOSFET biased in the OFF state when a heavy ion passing through deposits enough charge to turn the device on. SEBs can also occur in bipolar junction transistors.

The trend towards reducing device size and power; increasing the line resolution, memory, and speed of electronic devices only heighten SEU susceptibility. Integrated circuits already include electrostatic discharge networks, the purpose of which is to dissipate any static electricity or other high voltage problems during manufacturing, construction, handling, shipping, etc. In space, however, ESD networks actually create problems and concerns, especially when the ESD networks are between the power rails, because of the shorting and physical damage as presented above when bombarded by particles and/or cosmic rays in space. Bipolar circuits in electronic space applications have a high probability of being hit by a cosmic ray and therefore require high reliability. This invention addresses the need to create reliable ESD networks for space applications.

SUMMARY OF THE INVENTION

These needs and others are satisfied by first realizing that electrostatic discharge networks pose a hazard to the integrity of the circuitry in space. Upon that realization, then an electrostatic discharge network has been invented, the network comprising: a trigger element; a voltage clamping element connected to and initialized by the trigger element; and a redundant element in series with the voltage clamping element in which the trigger element, the voltage clamping element and the redundant element are located between a first voltage pad and a second voltage pad. The voltage clamping elements and/or the redundant elements may be a bipolar transistor, or a MOSFET transistor. There may also be a redundant trigger element either in series or in parallel with the first trigger element. Additional protection can be realized by connecting the ESD network to a dummy voltage pad or voltage rail not connected to processing circuitry.

In another embodiment of the invention, the clamping element further may comprise an array of unit cells, each unit cell comprising at least one transistor, the sum of the transistors of the array being electrically equivalent to a single clamping element, each unit cell separated from another unit cell by a distance at least as great as the distance a colliding proton could displace in the network. There may be barriers or trenches between the unit cells of the array.

A fault tolerant ESD network adapted to reduce the incidence of a system failure caused by a single event upset, comprises a first trigger circuit element; a first voltage clamp element connected to the first trigger circuit element; and a redundant voltage clamp element coupled in series with the first voltage clamp element. The first voltage clamp element and/or the redundant voltage clamp element and/or the trigger element and/or a redundant trigger element may actually be an array of unit cells, each unit cell comprising a plurality of transistors, the electrical sum of the unit cells being electrically equivalent to a single redundant voltage clamping transistor. Each unit cell may be different than another unit cell in the array.

The invention is also considered a method to design an ESD protection network, comprising the steps of: defining a reliability requirement of an integrated circuit for a single event upset; defining an electrostatic discharge requirement using a technology database file and ESD data; defining circuit topology of a redundant ESD element in series with a voltage clamping element of the ESD protection network to be applied between a first voltage and a second voltage; defining a unit cell to comprise the redundant ESD element using a SEU tool; and evaluating the probability of failure of the ESD protection network.

The invention is also a method to protect electronic circuitry in space, by first realizing that electrostatic discharge networks can cause circuitry to experience single event upsets or worse in space, and then including a redundant voltage clamping element in series with a first voltage clamping element between two voltage pads in the electrostatic discharge networks; and connecting at least one trigger element to the redundant voltage clamping element and the first voltage clamping element. The advantages of the invention set forth will further be realized upon a careful reading of the Description of the Invention in conjunction with the included Drawing.

DETAILED DESCRIPTION OF THE INVENTION

As discussed earlier, the collision of heavy ion particles often leads to secondary breakdown events in space caused by high energy protons and neutrons colliding with the silicon lattice of electronic circuits leading to fission fragments and damage to the electronic devices. Electrostatic discharge networks (ESD) can be used to quickly remove power from a circuit resulting from bombardment by cosmic rays but when the ESD network itself is hit, then catastrophic failure may occur because of excessive heat, or metallization or bond failure. Bipolar-based ESD networks, moreover, actually fail in space applications. Hereinafter the distinction between SEUs, SELs, and SEBs shall be merged and the event, whether it be a latch-up or a burn-out, shall simply be referred to a single event upset (SEU). Until now, the failure of ESD networks in space from SEUs has not been addressed.

Figure 1:
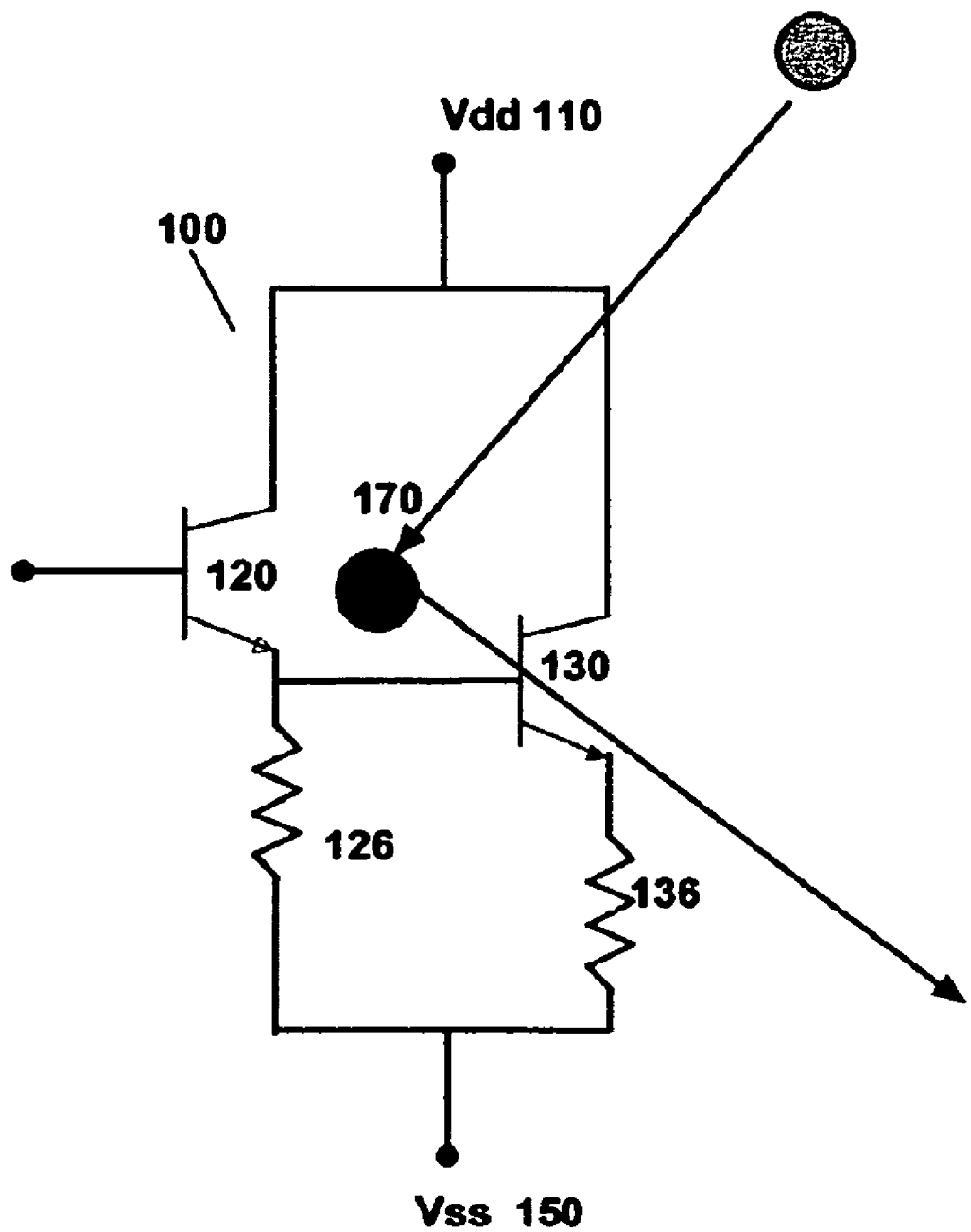
FIG. 1 is an electrical schematic of a prior art power clamp used in circuits.

FIG. 1 is a schematic of a prior art silicon germanium power clamp 100 that limits the current in an electrostatic discharge network. The power voltage, Vdd, 110 is connected across a trigger device 120 and a clamp device 130. The emitter of the trigger device 120 is connected to the base of the clamp device 130. A bias resistor 126 connected to the emitter of the trigger device limits the current flow to ground or Vss 150. In parallel to the bias resistor 126 is a ballast resistor 136 connected to the emitter of the clamp device. The ballast resistor 136 redistributes current through the clamp to provide electrical and thermal stability. FIG. 1 also shows a proton 160 colliding with a silicon atom 170 in the base of the clamping device 130. As a result of the collision, several events can occur. First, there can be electron-hole pair generation in the area of the collision; and second, the proton may be deflected and the silicon atom may recoil; and in some circumstances, the silicon atom may be fragmented causing permanent damage in the lattice leading to electrical and mechanical failure of the circuit. The mechanical and electrical damage can occur in a base region of a bipolar transistor creating an electrical short, called a silicon bipolar pipe, between the emitter and collector leading to the transistor failure. When this failure occurs in electrostatic discharge networks themselves, additional problems can arise because the entire chip or circuitry is no longer protected.

Figure 2:
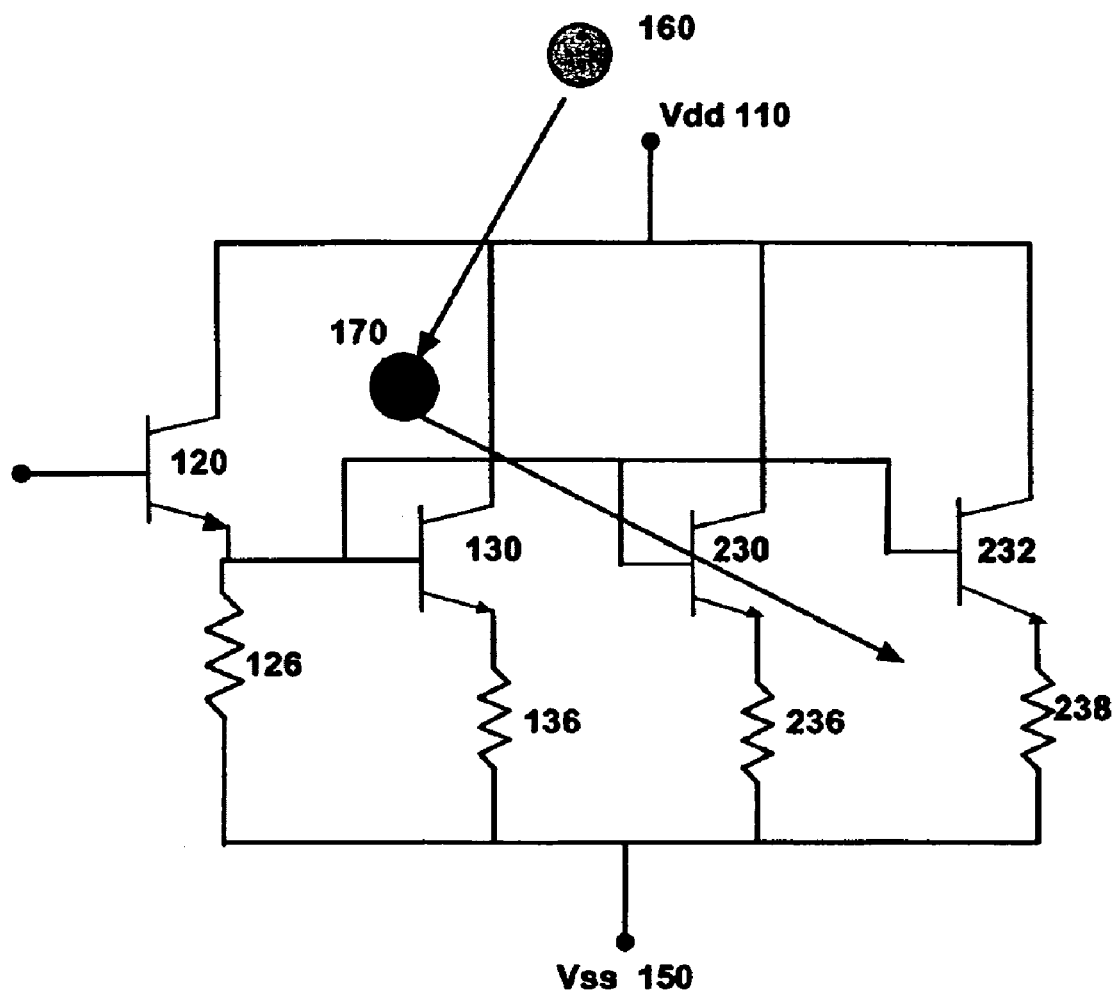
FIG. 2 is an electrical schematic of a prior art ESD power clamp.

FIG. 2 is a schematic of a prior art standard ESD power clamp 200. The top of the circuit is connected to an operating voltage Vdd 110. There is a trigger element 120 whose emitter is connected to a bias resistor 126 and the base of a clamping device 130. In addition, the emitter of the trigger element 120 is also connected to a number of other clamping elements 230, 232. Each clamping element 130, 230, 232 has its own ballast resistor 136, 236, 238, respectively. Note that each clamping element is still connected between Vdd 110 and Vss 150, such that a SEU could still disrupt the function of the circuit.

An ESD network having redundant elements can be used in a variety of semiconductor technologies, typically of silicon but also any Type III/V, Type II/IV semiconductor combinations, including but not limited to gallium arsenide, silicon germanium, indium phosphide, silicon-germanium-carbon, silicon-on-insulator, silicon bipolar etc. In fact, it is also realized that such an ESD network with a redundant element as described herein is applicable to an ESD network of MOSFET transistors because they inherently have a parasitic silicon bipolar transistor. SEUs are particularly problematic with bipolar transistors, and homo- and hetero-junction transistors because these transistors have narrow regions that make it easy for the collector to short with the Vdd, or the emitter to short to ground.

Figure 3:
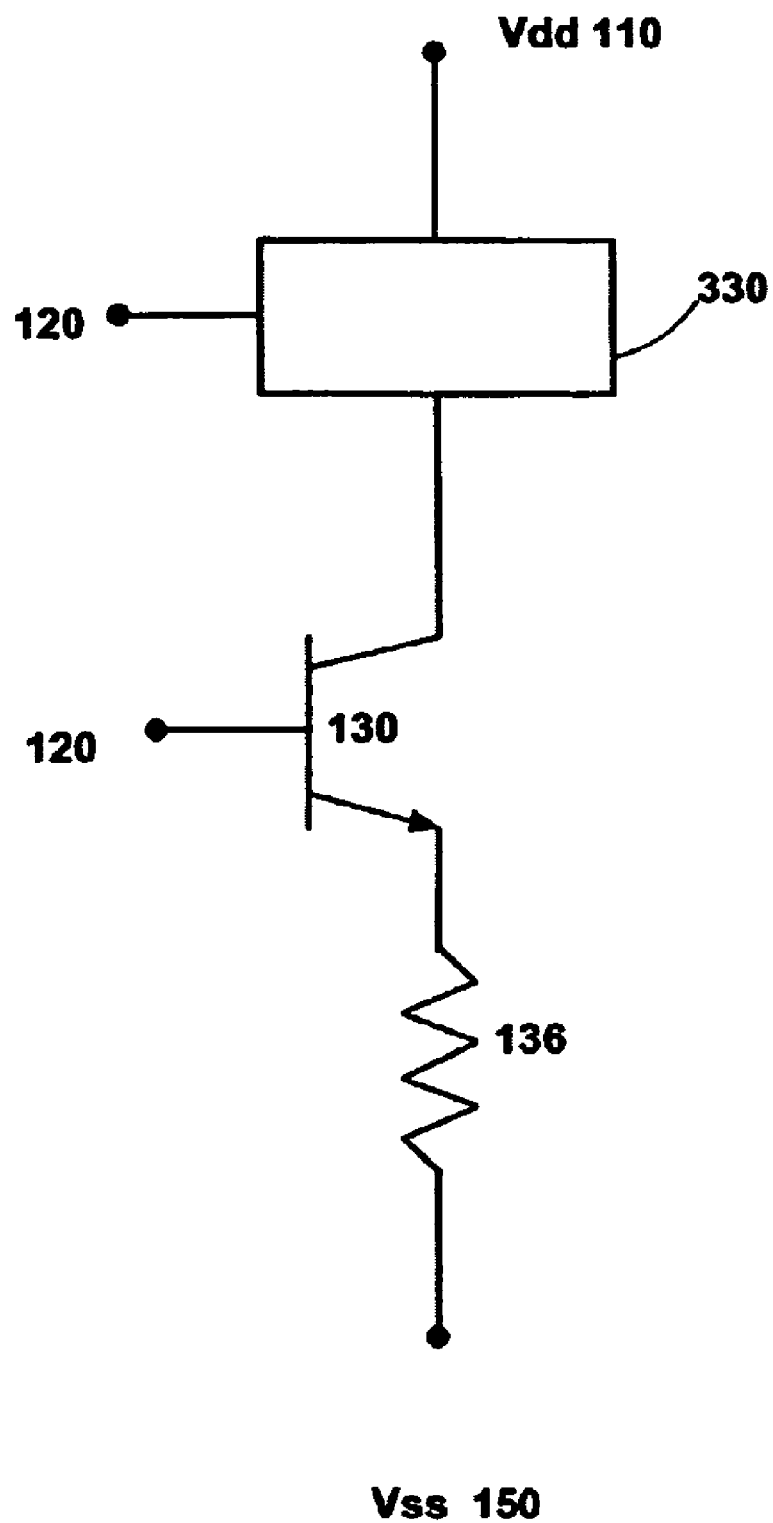
FIG. 3 is an electrical schematic of an ESD power clamp having an SEU redundant element in accordance with an embodiment of the invention.

One embodiment of a radiation tolerant ESD network has an ESD redundant circuit element in series or in parallel with the trigger element. Consider the simplified circuit diagram of FIG. 3. A redundant circuit element 330 may be connected to the same or different trigger element 120. A trigger element 120, which could also be the same or different trigger element as above, is also connected to the clamp device 130. Note that the redundant circuit element 330 is connected across a pad. For example, in FIG. 3, the pad is a power supply rail, voltage Vdd 110, and is connected through the circuits to another power supply rail or ground, Vss 150. The pad may also be a signal pad, wherein the ESD network as described herein is connected to an input signal pad, such as an input/output signal pad and the remaining circuitry. The inventor has discerned that redundant element 330 reduces and can even eliminate the probability of a SEU-induced electrical short in ESD networks by decoupling the voltage clamp element 130 from the voltage pad 110. The SEU redundant element 330 may be connected in series or parallel with the trigger element; but the SEU redundant element 330 is preferably connected in series with its respective clamping element. There may be more than one SEU redundant element connected in parallel with other redundant elements such that voltage clamping values sum together; just as there may be more than one clamping element in parallel with other clamping elements. One of skill in the art will further appreciate that the use of the word Aredundant@ does not necessarily mean identical, although the redundant element could be identical to either or both the trigger element and/or its respective clamping element. The redundant aspect of the element refers to its function, i.e., the redundant element 330 must fulfill some minimum limit or objective. When the redundant element 330 is used for ESD protection, it must have a net breakdown voltage greater that the voltage from the pad, e.g., Vdd 110 or the signal voltage. In other words, for ESD protection, the sum of the breakdown voltages across the redundant element 330 and the trigger element 120 or clamping element 130 independently must be greater than the application voltage.

Figure 4:
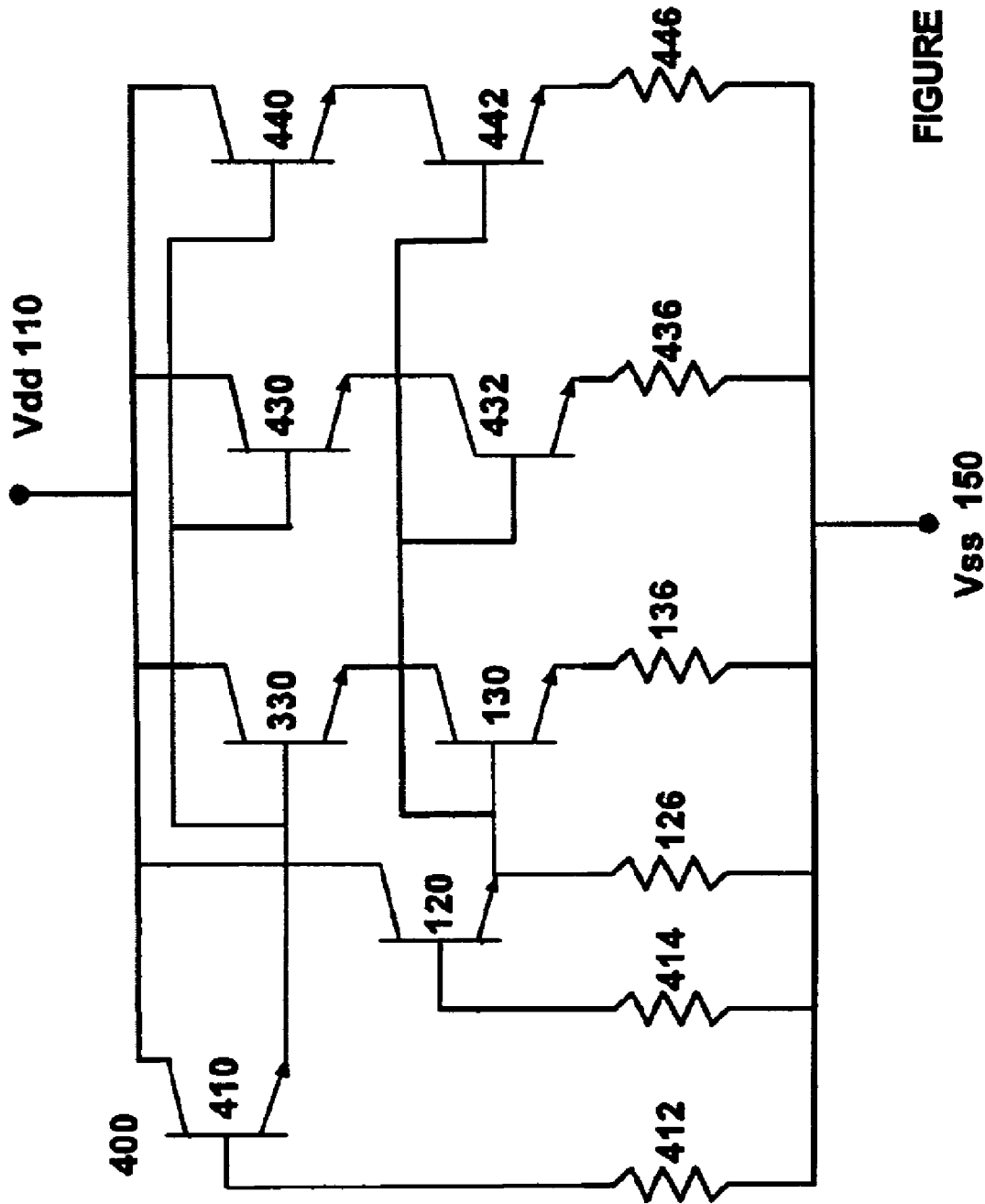
FIG. 4 is an electrical schematic of an ESD power clamp with radiation tolerant redundant elements in series in accordance with an embodiment of the invention.

FIG. 4 is a simplified circuit diagram of a radiation tolerant ESD network 400 having redundant elements 410, 330, 430, 440. Redundant element 410 may be a trigger element as a first stage, with clamping elements 330, 430, 440 as a second stage. Similarly, trigger element 120 would also be considered a first stage, with clamping elements 130, 432, 442 as a second stage. The redundant second stage is in a series cascode arrangement with the clamping second stage, i.e., each redundant element is in series with a voltage clamping element between the pad, power voltage Vdd 110, and its respective clamping element 130, 432, 442. Redundant trigger element 410 is connected to the second stage SEU redundant elements 330, 430, 440. In this embodiment, the redundant trigger element 410 is parallel to the trigger element 120 for the clamping elements 130, 432, 442. In some circumstances, it is desirable to bias the SEU redundant element, for example, the redundant trigger element 410 can be grounded with resistor 412. Clamping elements 130, 432, 442 may have substantially the same or may have different voltage clamping capabilities from each other and from their respective redundant elements 330, 430, 440.

Figure 5:
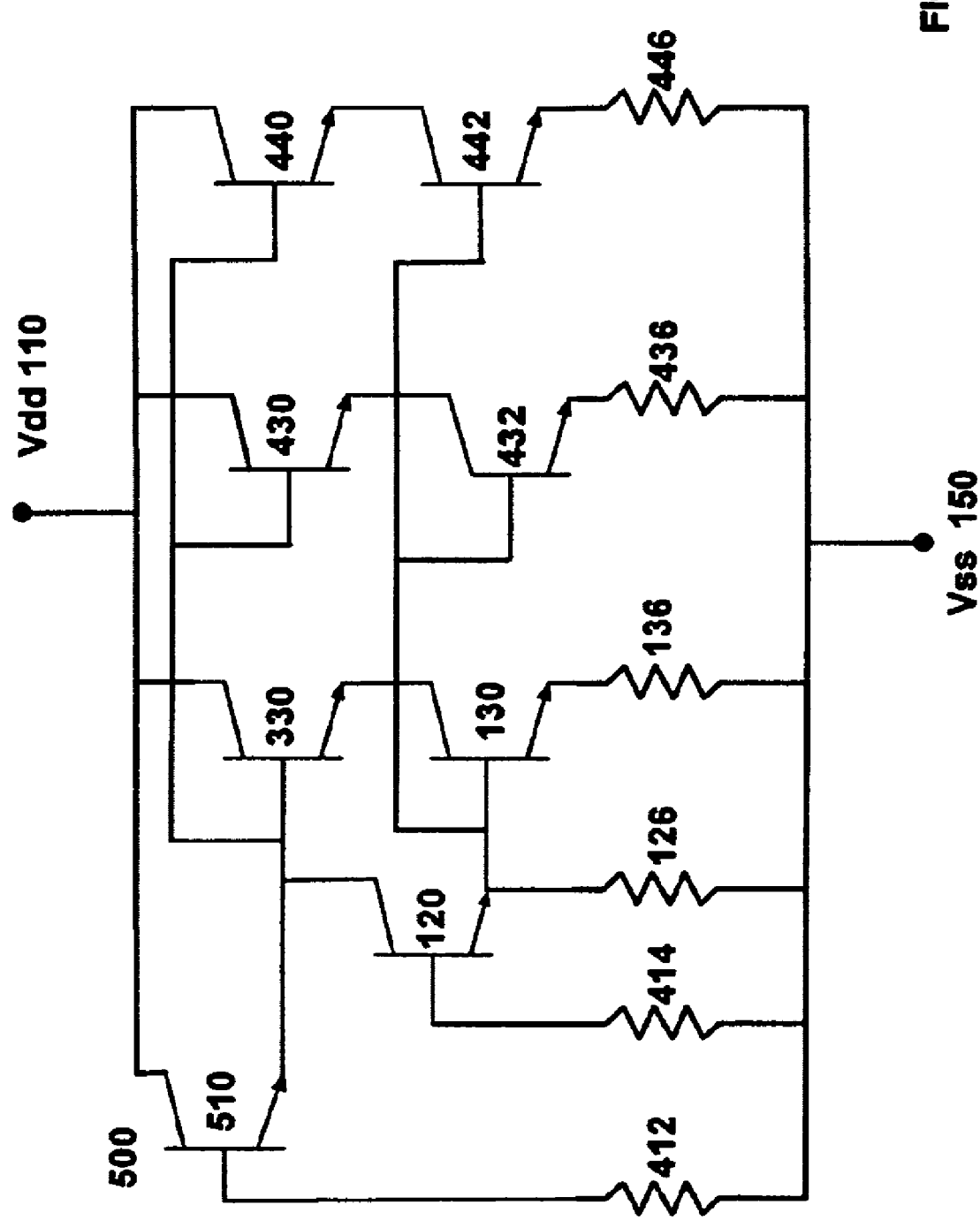
FIG. 5 is an electrical schematic of an ESD power clamp with radiation tolerant redundant elements in parallel in accordance with an embodiment of the invention.

FIG. 5 is a simplified circuit diagram of another embodiment of a radiation tolerant ESD circuit 500 in which the first stage, the redundant trigger element 510, is connected in series to the other first stage, the trigger element 120. The second stage comprising redundant clamping elements 330, 430, 440 is also in series with its respective redundant second stage, clamping elements 130, 432, 442.

Figure 6:
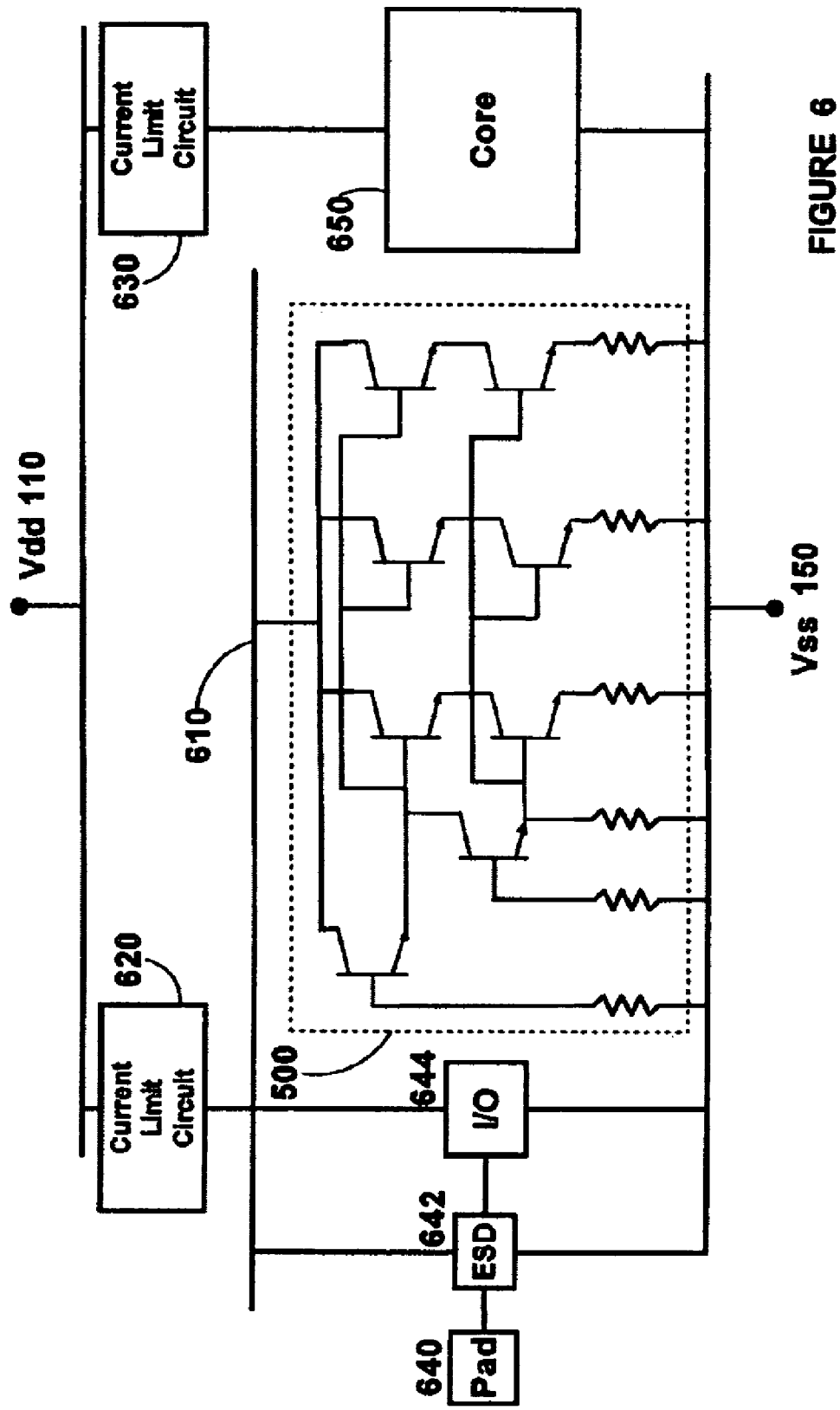
FIG. 6 is an electrical schematic of a radiation tolerant power clamp used with an isolation bus in accordance with an embodiment of the invention. It is suggested that FIG. 6 be printed on the cover of the patent.

Whether the radiation tolerant ESD circuit is shown as in FIG. 4 or in FIG. 5, the power or signal voltage pad Vdd 110 may yet be further isolated from the ESD power clamp circuit 500 using a redundant dummy pad 610, such as shown in FIG. 6. Between the power or signal voltage pad 110 and the dummy pad 610 there may be a current limit circuit 620 for the input/output chip circuitry 644; and another current limit circuit 630 between the power or signal pad 110 and the dummy pad 610 for the core circuitry 650. The ESD power clamp circuit 500 could be in parallel to the core 650; or could be in parallel with the both the core 650 and the current limit circuit 630. Note that in FIG. 6, two ESD protection networks 642 and 500 are shown; these networks may be the same or different depending upon their function. ESD protection network 500 is intended to protect the core 650 from ESD damage; whereas ESD protection network 642 may protect the I/O processing 644.

Figure 7:
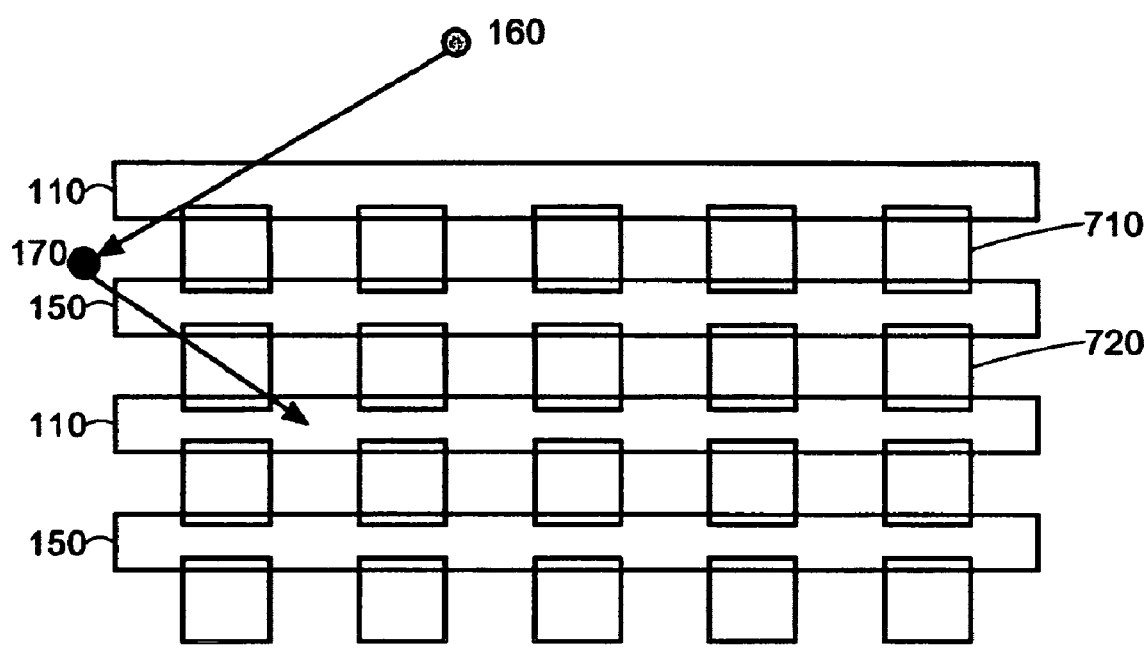
FIG. 7 is a pictorial representation of an array of ESD cells in accordance with an embodiment of the invention.

With respect to FIG. 7, the impact of an SEU can be even further reduced by creating each redundant and/or clamping element or trigger element as an ESD array 700 of small cells 710, 720. In the previous embodiments, one clamping element, one redundant element, or one trigger element were displayed. Typically, electrostatic discharge networks have large transistors on the order of fifty to hundreds of microns long. In a further embodiment, when a plurality of transistors of a smaller size, e.g., one micron, form a cell and the cells form an array that replace one large 100 or 1000 micron transistor, additional SEU resistance is achieved in ESD networks. This embodiment is particularly advantageous for bipolar transistors.

The advantages of such an array 700 replacing each trigger, clamping, and/or redundant element is that the charge collected by each transistor is less, the probability of a single transistor experiencing a collision is less, and the increase in resistance is greater: these advantageous factors combine to reduce the probability of a SEU event ($\sigma(\pi,\Sigma\iota)$, $\sigma(\nu,\Sigma\iota)$ event) in an ESD network. The self-ballasting effect of the array 700, moreover, protects more than merely adding redundancy and further limits the current of a given element if a SEU-induced failure occurs. The ESD array 700 further allows customization and personalization for the space environment, and parts per million (PPM) reliability requirement of space application and ESD requirements. The ESD circuit still has the requisite resistance but it is digitated into a plurality of resistances to decrease the probability of being hit and creating a natural series resistance that does not draw as much current as a large single transistor.

An ESD array 700 contains a plurality of unit cells 710, 720. The size of and the distance between the unit cells 710, 720 affect the probability of failure of more than one unit cell. The distance between the unit cells is preferably larger than the range of particle distribution and the length of track of the particles. For example, an alpha particle may travel up to 80 microns, so it is preferred that the distance be on the order of or greater than 80 microns.

The size of the unit cell is actually dependent upon many considerations as will be discussed with respect to FIG. 9. In general, however, the ESD networks of FIGS. 4-6 may be hundreds or thousands of microns. In order to be electrically equivalent, then the number of unit cells may be on the order of tens or hundreds of unit cells. For example, if a power clamp transistor is on the order of 1000 microns wide and has a series resistance of one ohm, the electrical equivalence might be ten unit cells of 100 microns each or there may be 100 units cells of 10 ohms per cell or there may be 1000 unit cells of one ohm each. The number, width, and resistance of the unit cell may vary with applications. The transistors may be of any electrical arrangement within the unit cell that supplies the equivalent protection as a single clamping or trigger or redundant element.

Figure 8A:
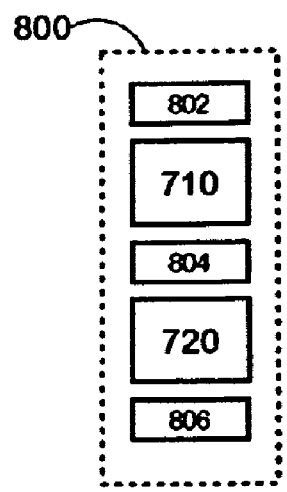
FIGS. 8a-8d are pictorial representations of different unit cells of an ESD array in accordance with different embodiments of the invention.
Figure 8B:
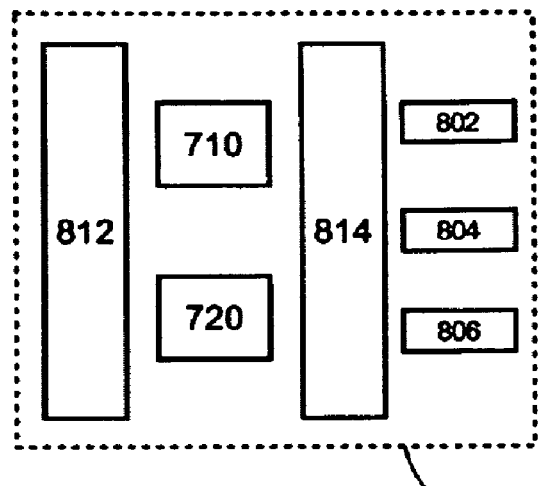
Figure 8C:
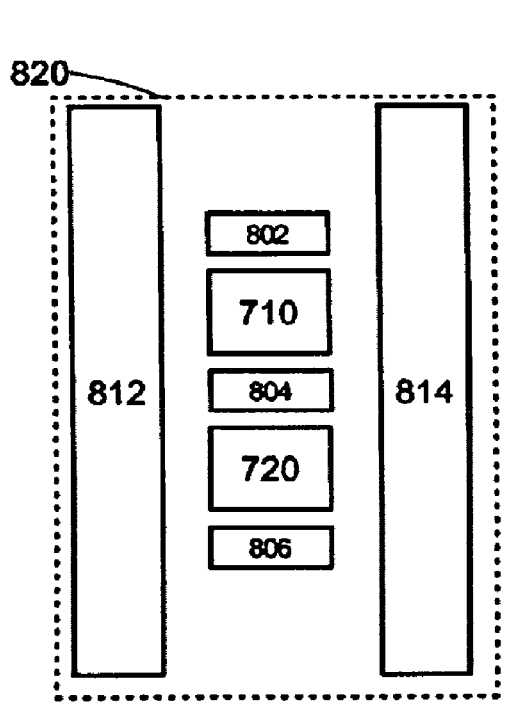
Figure 8D:
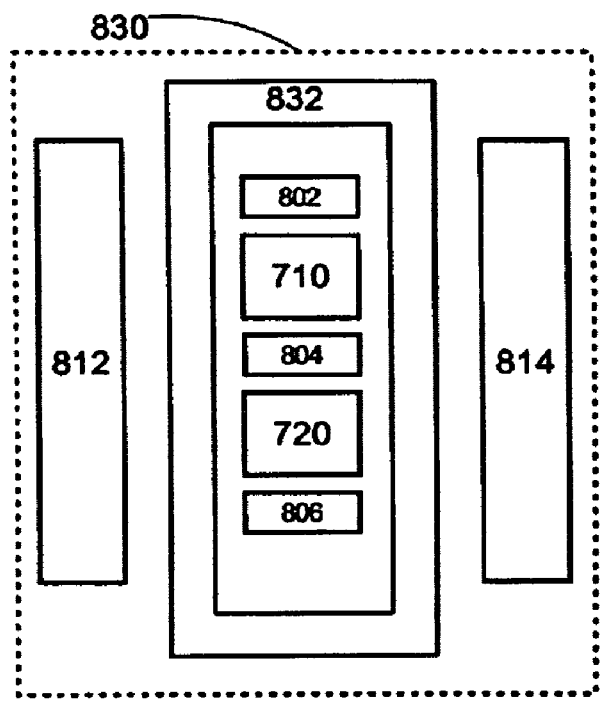

FIGS. 8a through 8d are simplified representations of a variety of unit cells 800. In FIG. 8a, between the unit cells 710, 720 are a plurality of other circuit elements R1 802, R2 804, R3 806 that may be part of or separate from the ESD circuits. The ESD array may further include SEU prevention features such as multiple high or medium breakdown or high performance heterojunction transistors, any of which may be characterized by speed and/or have a different base width. Other SEU prevention features may include ballasting resistors, and/or charge barriers such as trenches, guard rings, N-wells. The ESD gate array may further include process structures, such as heavily-doped buried layer connecting implants, reach-throughs, and/or buried grids. A trench is an actual trough between the unit cells of the ESD array. FIGS. 8b and 8c show a unit cell 810 having deep trenches 812, 814 on either side of the bipolar transistors 710, 720. In FIG. 8b, trench 814 separates the transistors 710, 720 from the circuit elements R2 804, R1 802, and R3 806. In FIG. 8c, the circuit elements R2 804, R1 802, and R3 806 are contained between the trenches 812, 814. A trench may be of sufficient dimensions to prevent charge from entering the unit cell, such as 3-12 microns deep and 1 micron wide; a trench may partially or completely surround the unit cell 830 in a circular, rectangular, or other geometric arrangement. FIG. 8d is an illustration of a unit cell 830 having both tenches 812, 814 and a charge barrier 832. Examples of charge barriers include diffusions of n-wells or substrate contacts, or other devices that college charge. An example of a diffusion of n-wells may be arsenide or phosphorus at a concentration of $5 \times 10^{13}$ atoms per $cm^3$. Use of both the trenches 812, 814 and the guard ring 832 provide additional protection from SEUs.

Figure 9:
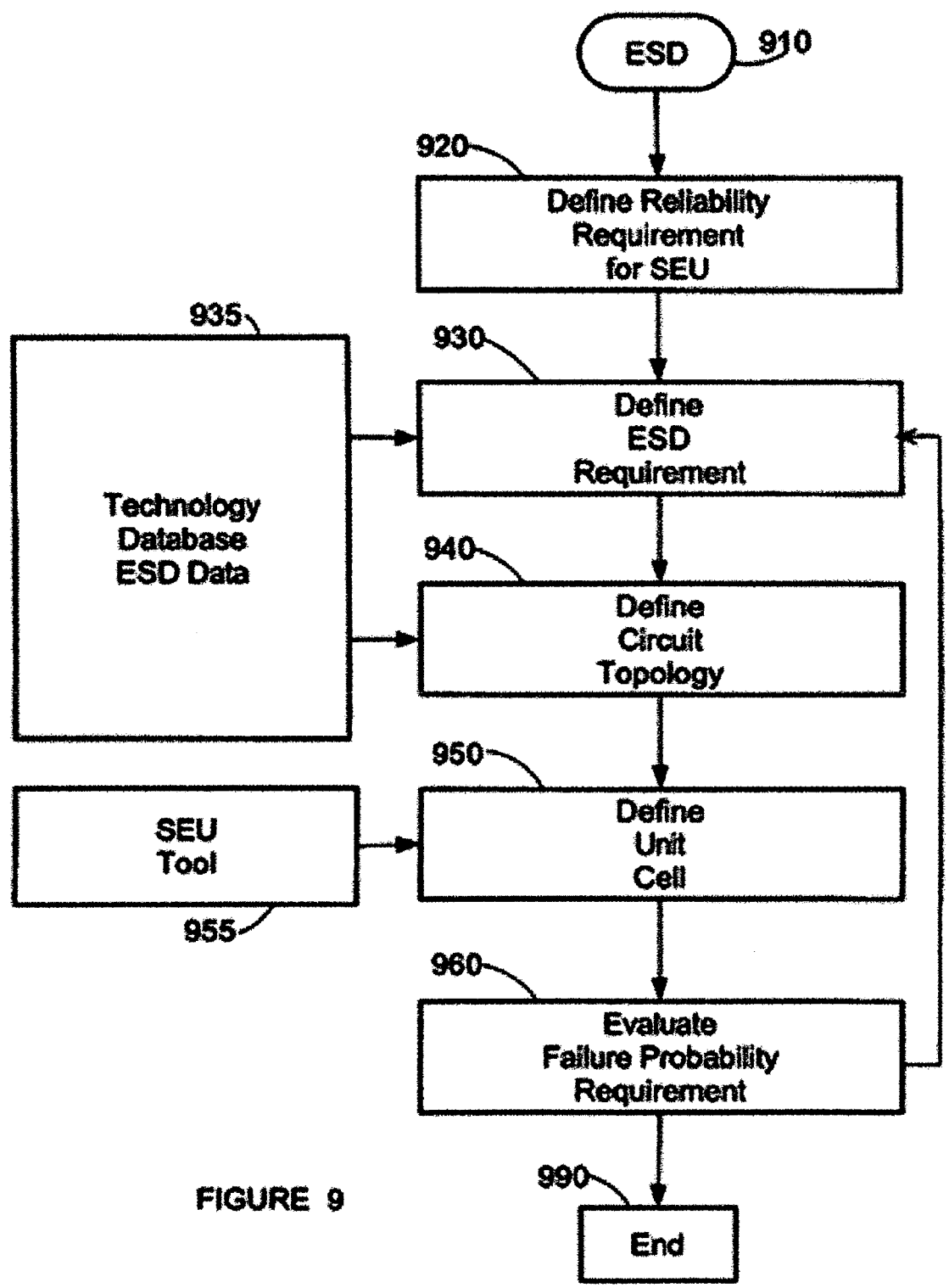
FIG. 9 is a simplified flow chart of the method by which an ESD array can be designed in accordance with an embodiment of the invention.

FIG. 9 is a simplified flow chart of a process by which an ESD array may be designed. In step 910, it is established that there is a need for an ESD network. In step 920, the engineers will define the reliability requirement for a SEU using, e.g., characterizations from transmission line pulse testing with energy ranges similar to those used in human body model (HBM) ESD qualification testing or cable discharge events (CDE). Then, input from the technology database file and ESD data 935 is used to define the ESD requirement in step 930. For example, for ESD protection in military applications, an ESD network may be required that protects against a 1 MeV particle through the Van Allen belt, or protect against a 500 volt pulse on the input pad or 15,000 volts human body model (HBM). Such ESD requirements that the circuit must be able to withstand can be further delineated by viewing www.esda.org/standardlistings.html. In step 940, the circuit topology 940 of the ESD network and if an array is used, the topology of the array is designed. Using an SEU tool 955 that determines the probability of failure using, e.g., a Monte Carlo alpha particle or a cosmic ray simulator, the layout design of the unit cell is defined in step 950. In step 960, the probability requirement of failure is evaluated. With the unit cell thus defined, the failure probability evaluated for a particular circuit, the process completes at step 990.

It will be appreciated that variations of some elements are possible to adapt the invention for specific conditions or functions. The concepts of the present invention can be further extended to a variety of other applications that are clearly within the scope of this invention. Having thus described the present invention with respect to preferred embodiments as implemented, it will be apparent to those skilled in the art that many modifications and enhancements are possible to the present invention without departing from the basic concepts as described in the preferred embodiment of the present invention. Therefore, what is intended to be protected by way of letters patent should be limited only by the scope of the following claims.

What is claimed is:

1. An electrostatic discharge network, comprising:
   a trigger element directly connected to a first voltage pad, coupled to a second voltage pad, and directly connected to a voltage clamping element;
   said voltage clamping element directly connected between said first voltage pad and a redundant voltage clamping element; and
   said redundant voltage clamping element coupled to said second voltage pad.

2. The electrostatic discharge network of claim 1, wherein the voltage clamping element is a single bipolar transistor.

3. The electrostatic discharge element of claim 1, wherein the voltage clamping element is a MOSFET transistor.

4. The electrostatic discharge network as in claim 1, further comprising a redundant trigger element, said redundant trigger element connected to said first voltage pad through said trigger element, said redundant trigger element directly connected to said clamping element and said redundant clamping element, said redundant triggering element coupled to said second voltage pad.

5. The electrostatic discharge network as in claim 1, further comprising a redundant trigger element, said redundant trigger element directly connected to said first voltage pad and said redundant clamping element and coupled to said second voltage pad.

6. The electrostatic discharge network as in claim 1, further comprising:
   an I/O circuit connected to an I/O pad; and
   a third voltage pad connected to said I/O circuit, said third voltage pad different from said first and second voltage pads.

7. The electrostatic discharge network as in claim 1, wherein the voltage clamping element further comprises an array of unit cells, each unit cell comprising at least one transistor, each unit cell separated from another unit cell by a distance at least as great as the distance a colliding proton could displace in the network.

8. The electrostatic discharge network as in claim 7, further comprising a charge barrier between the unit cells of the array.

9. The electrostatic discharge network as in claim 1, wherein the redundant voltage clamping element further comprises an array of unit cells, each unit cell comprising at least one transistor, each unit cell separated from another unit cell by a distance at least as great as the distance a colliding proton could displace in the network.

10. The electrostatic discharge network as in claim 9, further comprising a charge barrier between the unit cells of the array.

11. The electrostatic discharge network of claim 1, wherein said trigger element is a bipolar transistor.

12. The electrostatic discharge network of claim 4, wherein said redundant trigger element is a bipolar transistor.

13. The electrostatic discharge network of claim 4, wherein said trigger element is a bipolar transistor and redundant trigger element is a bipolar transistor.

14. A fault tolerant ESD network adapted to reduce the incidence of a system failure caused by a single event upset, comprising:
   a first trigger element;
   a first array of transistors comprising a first voltage clamp, each transistor of said first array of transistors connected to the first trigger element, each transistor of said first array of transistors being a same type and polarity, each transistor of said first array of transistors connected directly to a first voltage pad;
   a second trigger element; and
   a second array of transistors comprising a second voltage clamp, each transistor of said second array of transistors connected to the second trigger element, each transistor of said second array of transistors being a same type and polarity, each transistor of the second array transistors connected between a corresponding transistor of said first array of transistors and a second voltage pad.

15. The fault tolerant ESD network of claim 14, wherein the first trigger element and the second trigger element are connected directly to said first voltage pad.

16. The fault tolerant ESD network of claim 14, wherein said first trigger element is connected directly to said first voltage pad and said second trigger element is connected to said first voltage pad through said first trigger device.

17. The fault tolerant ESD network of claim 14, wherein said first trigger element is a bipolar transistor.

18. The fault tolerant ESD network of claim 14, wherein said second trigger element is a bipolar transistor.

19. The fault tolerant ESD network of claim 14, wherein said first trigger element is a bipolar transistor and said second trigger element is a bipolar transistor.

20. The fault tolerant ESD network of claim 14, wherein each transistor of said first array of transistor and each transistor of said second array of transistors is a NPN bipolar transistor.

* * * * *